(12) United States Patent
Kato et al.

(10) Patent No.: US 10,461,736 B2
(45) Date of Patent: Oct. 29, 2019

(54) SEMICONDUCTOR DEVICE

(71) Applicant: DENSO CORPORATION, Kariya, Aichi-pref. (JP)

(72) Inventors: Yoshitaka Kato, Kariya (JP); Kenji Komiya, Kariya (JP); Yusuke Shindo, Kariya (JP); Yoshinori Hayashi, Kariya (JP); Kenichi Wakabayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/278,337

(22) Filed: Feb. 18, 2019

(65) Prior Publication Data

US 2019/0181856 A1    Jun. 13, 2019

Related U.S. Application Data

(63) Continuation of application No. PCT/JP2017/028661, filed on Aug. 8, 2017.

(30) Foreign Application Priority Data

Aug. 26, 2016    (JP) ................. 2016-165879

(51) Int. Cl.
*H03K 17/16*    (2006.01)
*H02M 1/08*    (2006.01)
*H02M 1/32*    (2007.01)
*H02M 7/537*    (2006.01)
*H02M 3/158*    (2006.01)
(Continued)

(52) U.S. Cl.
CPC ............ *H03K 17/166* (2013.01); *H02M 1/08* (2013.01); *H02M 1/32* (2013.01); *H02M 3/158* (2013.01); *H02M 7/537* (2013.01); *H02M 7/53875* (2013.01); *H02M 2001/007* (2013.01);
(Continued)

(58) Field of Classification Search
None
See application file for complete search history.

(56) References Cited

U.S. PATENT DOCUMENTS

2002/0017941 A1*    2/2002    Tsukagoshi ........ H03K 17/0822
                                                              327/322
2004/0196678 A1    10/2004    Yoshimura et al.
(Continued)

FOREIGN PATENT DOCUMENTS

JP    2006-014402 A    1/2006
JP    2014-127728 A    7/2014

*Primary Examiner* — Cassandra F Cox
(74) *Attorney, Agent, or Firm* — Posz Law Group, PLC

(57) ABSTRACT

A semiconductor device turns on and off a power switching device having a gate terminal and output terminals between which an output current is produced by a gate voltage applied to the gate terminal. The semiconductor device includes: an output current detector detecting a current value correlated with the output current; a voltage detector detecting a voltage across the output terminals of the power switching device; a clamp circuit clamping the gate voltage at a predetermined value; and a controller controlling the clamp circuit to adjust the gate voltage based on the voltage detected by the voltage detector. The controller controls the clamp circuit to set the gate voltage to be at a minimum voltage according to the detected voltage to cause the output current to be larger than a threshold current required for detecting the short circuit in the power switching device.

10 Claims, 6 Drawing Sheets

(51) Int. Cl.
*H02M 7/5387* (2007.01)
*H02M 1/00* (2006.01)

(52) U.S. Cl.
CPC ............... *H02M 2001/0009* (2013.01); *H03K 2217/0081* (2013.01)

(56) References Cited

U.S. PATENT DOCUMENTS

| | | |
|---|---|---|
| 2013/0063188 A1 | 3/2013 | Sogo et al. |
| 2014/0085762 A1 | 3/2014 | Shimano et al. |
| 2015/0057822 A1* | 2/2015 | Baldridge ............... G01R 21/06 700/293 |
| 2017/0302151 A1* | 10/2017 | Snook ..................... H02M 1/08 |
| 2018/0270913 A1* | 9/2018 | Bredemeier ........... H05B 6/062 |

* cited by examiner

SEMICONDUCTOR DEVICE

CROSS REFERENCE TO RELATED APPLICATIONS

The present application is a continuation application of International Patent Application No. PCT/JP2017/028661 filed on Aug. 8, 2017, which designated the U.S. and claims the benefit of priority from Japanese Patent Application No. 2016-165879 filed on Aug. 26, 2016. The entire disclosures of all of the above applications are incorporated herein by reference.

TECHNICAL FIELD

The present disclosure relates to a semiconductor device.

BACKGROUND

In a turn-on operation of a power switching device, there is a phase for determining a short circuit in a power switching device. Conventionally, in such a short circuit determination phase, output current is limited by clamping a gate voltage to be applied to the power switching device at a predetermined value. Therefore, it is possible to reduce energy consumption during the short circuit as compared with a situation in which the gate voltage is not clamped.

SUMMARY

The present disclosure provides a semiconductor device for driving a power switching device.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
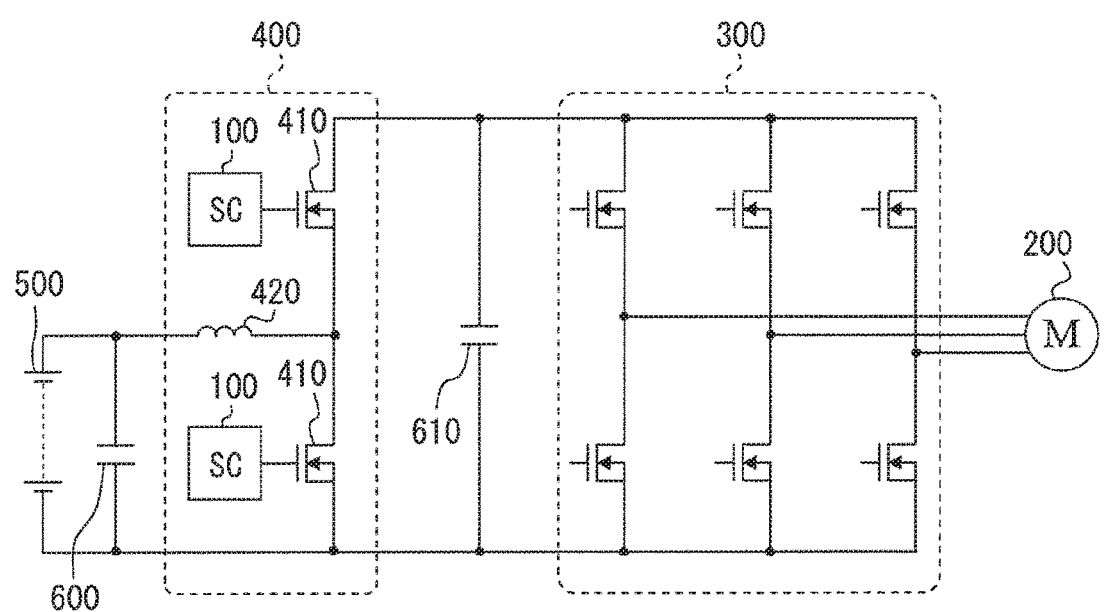
FIG. 1 is a circuit diagram that shows a schematic configuration of a power converter according to a first embodiment.

Even under a condition in which a saturation current during having a short circuit is at minimum, it is still required to determine a gate voltage to cause an output current exceeding a threshold current for determining the short circuit. For example, when MOSFET or IGBT is used as a power switching device, since the saturation current depends on a drain-source voltage Vds or collector-emitter voltage Vce, the effect of suppressing short circuit energy is not sufficient under a condition that these voltages are relatively high. An issue such as miniaturization of a chip being restricted may occur as the short circuit energy increases.

According to an aspect of the present disclosure, a semiconductor device controls a power switching device to turn on and off. The power switching device has a gate terminal and output terminals between which an output current is produced by a gate voltage applied to the gate terminal. The semiconductor device includes: an output current detector configured to detect a current value correlated with the output current; a voltage detector configured to detect a voltage, which is across the output terminals of the power switching or is correlated with the voltage across the output terminals; a clamp circuit configured to clamp the gate voltage at a predetermined value; and a controller configured to control the clamp circuit to adjust the gate voltage based on the voltage detected by the voltage detector. The controller controls the clamp circuit to set the gate voltage to be at a minimum voltage according to the detected voltage to cause the output current, which flows during having the short circuit in the power switching device, to be larger than a threshold current required for detecting the short circuit in the power switching device.

Accordingly, the value of the output current can be changed flexibly as compared with a conventional configuration in which the clamp voltage is set to be constant. In particular, it is possible to determine the gate voltage to control the power switching device to output a minimum current required for short circuit detection according to a voltage correlated with a voltage across output terminals such as Vds or Vce or a voltage VH, which will be described hereinafter. Therefore, it is possible to suppress the short circuit energy caused by the output current during having the short circuit.

Embodiments of the present disclosure will be hereinafter described with reference to the drawings. Parts identical or equivalent to each other among various drawings are given the same reference numerals.

First Embodiment

The following firstly describes a schematic configuration of a semiconductor device according to the present embodiment with reference to FIGS. 1 to 5. In the drawings, SC denotes a semiconductor device 100, OC denotes an output current detector 130, VD denotes a voltage detector 140, CN denotes a controller 150 and N1 denotes a motor 200.

As shown in FIG. 1, the semiconductor device 100 is provided to a voltage converter circuit 400, which is configured to supply power to an inverter circuit 300 in a power converter for driving, for example, the motor 200 to be mounted to a vehicle.

The power converter raises an output voltage of a battery 500 and converts DC power to AC power having a frequency suitable to travelling and outputs the AC power to the motor 200. That is, the power converter includes the voltage converter circuit 400 and the inverter circuit 300. Capacitors 600, 610 are respectively provided at an input and an output of the voltage converter circuit 400. The capacitors 600, 610 are configured to perform current smoothing.

The voltage converter circuit 400 is configured by a switching series circuit having two power switching devices 410 connected in series and a reactor 420. Although the power switching device 410 according to the present embodiment is a typical NMOS transistor, it may be configured by other types of transistor such as IGBT. The voltage converter circuit 400 illustrated in FIG. 1 can raise a voltage in a direction from the battery 500 to the inverter circuit 300, it can lower a voltage in the reverse direction. Although the circuit configuration of the voltage converter circuit 400 is generally known so that the detailed description is omitted, the voltage converter circuit 400 according to the present embodiment includes a semiconductor device 100 for controlling a gate voltage of the power switching device 410. The configuration of the semiconductor device 100 is described hereinafter.

The inverter circuit 300 includes a configuration in which three switching series circuits, which are the same as the switching series circuit in the voltage converter circuit 400, are connected in parallel. An alternating current is output from the intermediate point of each of the switching series circuit. Since the configuration of the inverter circuit 300 in FIG. 1 has been known, the detailed description thereof is omitted.

The following describes the semiconductor device 100 and the power switching device 410 as a control target of the semiconductor device 100 in detail.

Figure 2:
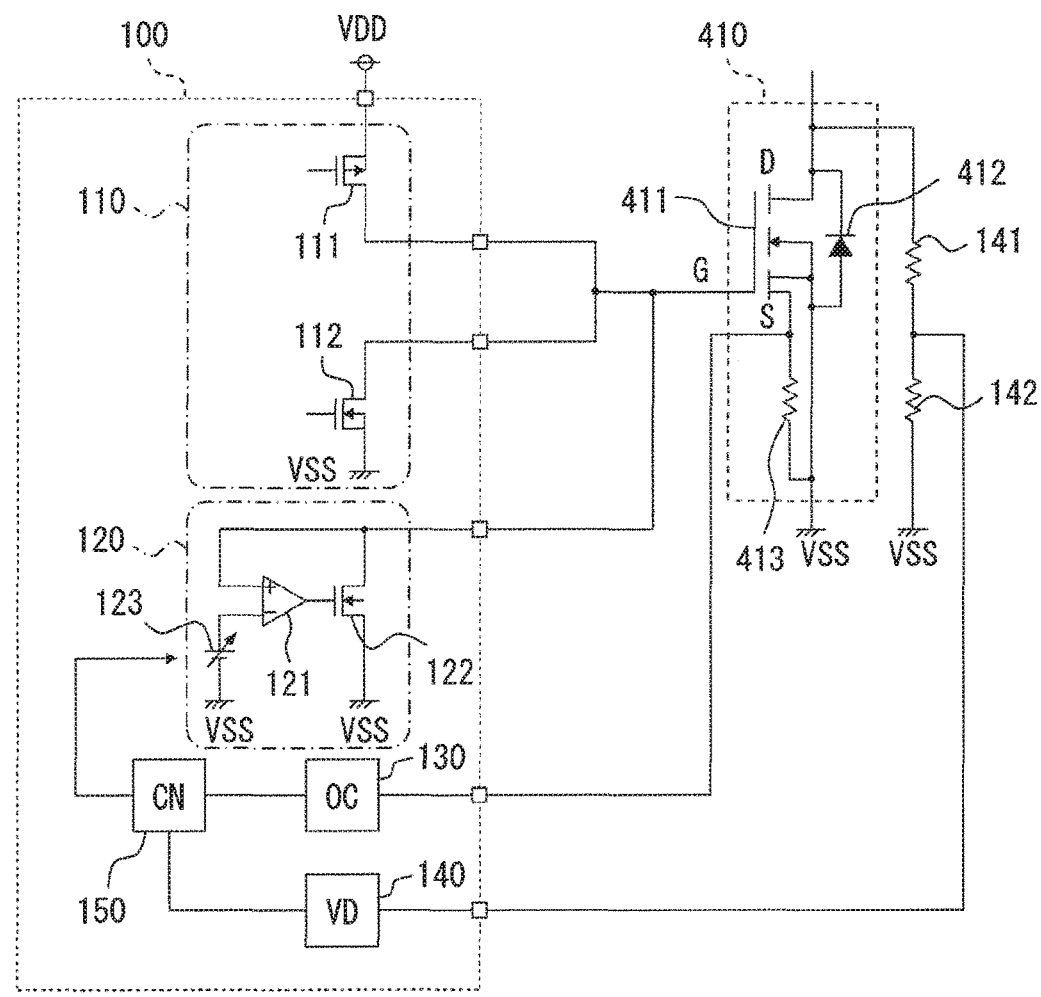
FIG. 2 is a circuit diagram that shows a configuration with a semiconductor device and a power switching device.

As shown in FIG. 2, the power switching device 410 is an NMOS transistor, and includes a transistor 411 and a freewheeling diode 412 connected to the transistor 411 in an anti-parallel manner. That is, the cathode terminal of the freewheeling diode 412 is connected to the drain terminal (D) of the transistor 411 as one of the output terminals of the transistor 411, and the anode terminal of the freewheeling diode 412 is connected to the source terminal (S) of the transistor 411 as the other output terminal of the transistor 411. A sense resistor 413 is connected to the source terminal of the transistor 411. The sense resistor 413 is configured to detect current correlated with output current flowing between the drain and source.

The semiconductor device 100 includes a driver circuit 110, a clamp circuit 120, the output current detector 130, the voltage detector 140 and the controller 150.

The driver circuit 110 is configured such that a PMOS transistor 111 and an NMOS transistor 112 are connected in series between a power supply potential VDD and a reference potential VSS. The intermediate point between the PMOS transistor 111 and the NMOS transistor 112 is connected to the gate terminal (G) of the power switching device 410. When one of the PMOS transistor 111 or the NMOS transistor 112 is turned on, the gate voltage of the power switching device 410 is adjusted by supplying charge to the gate terminal or attracting charge from the gate terminal.

The clamp circuit 120 includes an operational amplifier 121, an NMOS transistor 122, and a variable power supply 123. The non-inverting input terminal of the operational amplifier 121 is connected to the gate terminal of the transistor 411 in the power switching device 410. On the other hands, the inverting input terminal of the operational amplifier 121 is connected to the variable power supply 123 whose output voltage is variable, and the inverting input terminal of the operational amplifier 121 receives an input of a reference voltage Vref. The output terminal of the operational amplifier 121 is connected to the gate terminal of the NMOS transistor 122. The NMOS transistor 122 has: a drain terminal that is connected to the non-inverting input terminal and the gate terminal of the power switching device 410; and a source terminal that is connected to the reference potential VSS.

The operational amplifier 121 constitutes a negative feedback circuit whose output is fed back to the non-inverting input terminal through the NMOS transistor 122, and the NMOS transistor 122 is in operation such that the potential of the non-inverting input terminal is equal to the reference voltage Vref to be input to the inverting input terminal. Since the non-inverting input terminal of the operational amplifier 121 is connected to the gate terminal of the power switching device 410, the gate voltage to be input to the power switching device 410 is clamped at the reference voltage Vref.

The output current detector 130 detects a current value of output current flowing between the drain and source of the power switching device 410 or a current value of sense current correlated with the output current. The output current detector 130 according to the present embodiment detects the sense current flowing from the source terminal of the power switching device 410 through the sense resistor 413. The detected current value is compared with a predetermined threshold current value for determining a short circuit of the power switching device 410.

The voltage detector 140 detects an output voltage of the power switching device 410 or a voltage correlated with the output voltage. Since the power switching device 410 according to the present embodiment is an NMOS transistor, the voltage detector 140 detects a voltage Vds between the drain and source. As shown in FIG. 2, the voltage detector 140 detects output voltage Vds by detecting a potential at the intermediate point between the resistors 141 and 142, which are connected in series between the drain potential and the reference potential VSS.

The controller 150 controls the transistors 111 and 112 in the driver circuit 110 to turn on and off. Additionally, the reference voltage in the clamp circuit 120 is controlled based on the output voltage Vds to be detected by the voltage detector 140.

Although a general design of current detection and voltage detection can be respectively adopted as the particular configuration of the output current detector 130 and the voltage detector 140, several forms will be described.

Figure 3:
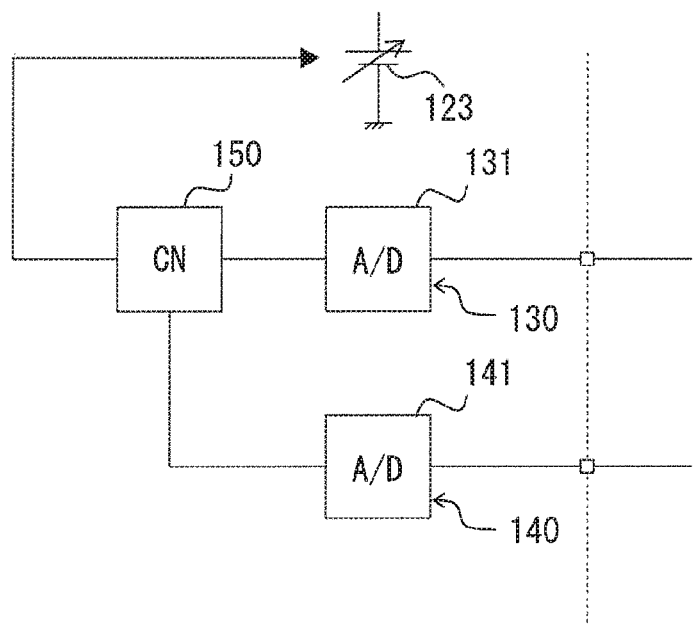
FIG. 3 is a circuit diagram that shows a detailed configuration with an output current detector and a voltage detector.

In one of forms, as shown in FIG. 3, the output current detector 130 includes an A/D converter 131, and the voltage detector 140 includes an A/D converter 141.

In such a form, a current value of sense current to be input to the output current detector 130, more precisely, a value of a voltage across both ends of the sense resistor 413, is converted through the A/D converter 131, and the converted value is input to the controller 150.

On the other hands, the output voltage Vds to be input to the voltage detector 140 and a voltage value correlated with Vds is converted through the A/D converter 141 and then the converted value is input to the controller 150.

The controller 150 includes at least a logic circuit and a register. The value of the sense current and the value of the output voltage Vds, which are converted through A/D conversion, are input to the logic circuit. The logic circuit determines whether the value of the sense current exceeds the value of the threshold current. The logic circuit is shifted into a phase for determining a short circuit if the value of the sense current exceeds the value of the threshold current. In the phase for determining the short circuit, the logic circuit selects a value of the reference voltage Vref corresponding to the output voltage Vds, which is input to the logic circuit, by referring to the register. Subsequently, the register controls the variable power supply 123 to be at a value obtained by selecting the value of the reference voltage Vref. The value of the reference voltage Vref associated with the output voltage Vds is preliminarily stored in the register.

Figure 4:
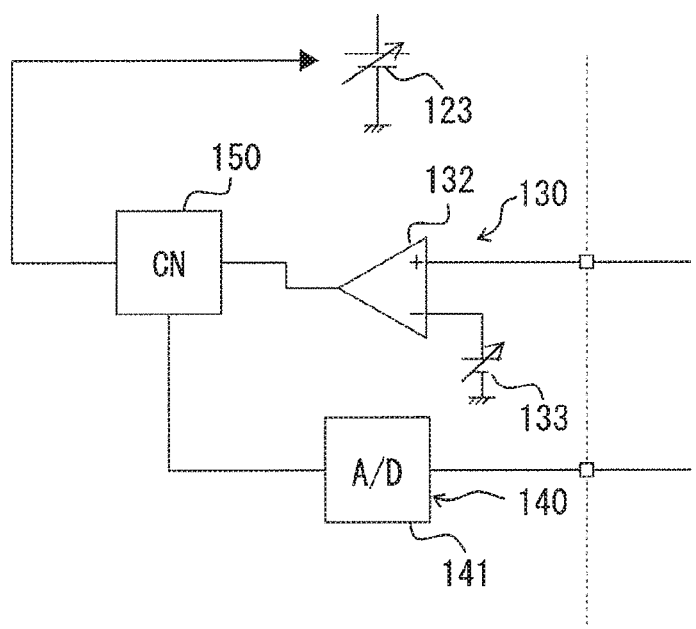
FIG. 4 is a circuit diagram that shows the detailed configuration with the output current detector and the voltage detector.

With regard to another form, the configuration of the output current detector 130 is different from the above-mentioned configuration as shown in FIG. 4. The output current detector 130 in the form as shown in FIG. 4 includes a comparator 132 and a threshold power supply 133, which generates a voltage value according to the threshold current. The current value of the sense current to be input to the output current detector 130, more precisely, the value of a voltage across both ends of the sense resistor 413, is compared with the voltage according to the threshold current generated by the threshold power supply 133 through the comparator 132. In other words, the current value of the sense current is compared with the value of the threshold current in analog form, and the output reflecting the comparison result is output from the comparator 132 to the controller 150. If the value of the sense current exceeds the value of the threshold current, the controller 150 is shifted into the phase for determining the short circuit.

Even with such a form, the controller 150 also includes at least the logic circuit and the register. The logic circuit in the controller 150 selects the value of the reference voltage Vref according to the output voltage Vds input to the logic circuit by referring to the register. Subsequently, the register controls the variable power supply 123 to be at a value obtained by selecting the value of the reference voltage Vref.

In the above-mentioned two forms, since the value of the output voltage Vds is converted through the A/D converter 141 and is input to the controller, a time lag may occur in changing the reference voltage Vref by the conversion time related to the A/D conversion. Accordingly, in the above-mentioned two forms, the value of the output voltage Vds is constantly monitored, the value prior to turning on the power switching device 410 is adopted for selecting the reference voltage Vref. In other words, in the above-mentioned two forms, the controller 150 executes feedforward control on the output voltage Vds.

Figure 5:
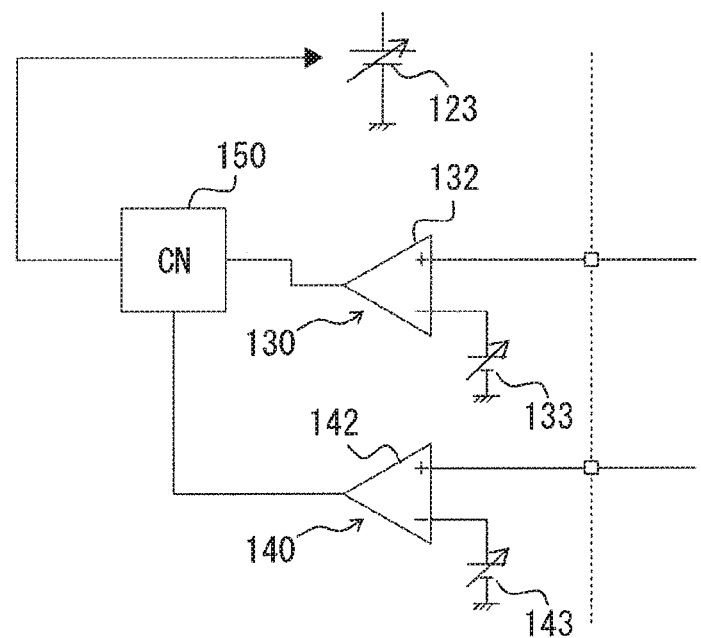
FIG. 5 is a circuit diagram that shows the detailed configuration with the output current detector and the voltage detector.

In the other form with reference to FIG. 5, the configuration of the voltage detector 140 is further different from the above-mentioned configuration. The voltage detector 140 in the form illustrated in FIG. 5 includes a comparator 142 and a threshold power supply 143 that generates a threshold voltage for switching the reference voltage Vref. The value of the output voltage Vds to be input to the voltage detector 140 is compared with the value of the threshold voltage generated by the threshold power supply 143 through the comparator 142. In other words, the value of the output voltage Vds is compared with the value of the threshold voltage in analog form, the output reflecting the comparison result is output from the comparator 142 to the controller 150.

With such a form, the controller 150 does not need to have the logic circuit or the register. When the value of sense current exceeds the value of the threshold current, the controller 150 determines the reference voltage Vref in the clamp circuit 120 in association with the magnitude relation between the output voltage Vds and the threshold voltage generated by the threshold power supply 143. In other words, the controller 150 in this form feeds the output voltage Vds back to the reference voltage Vref in real time.

Hereinafter, with reference to FIGS. 6 and 7, the operations and effects of the controller 150 will be described in detail.

Figure 6:
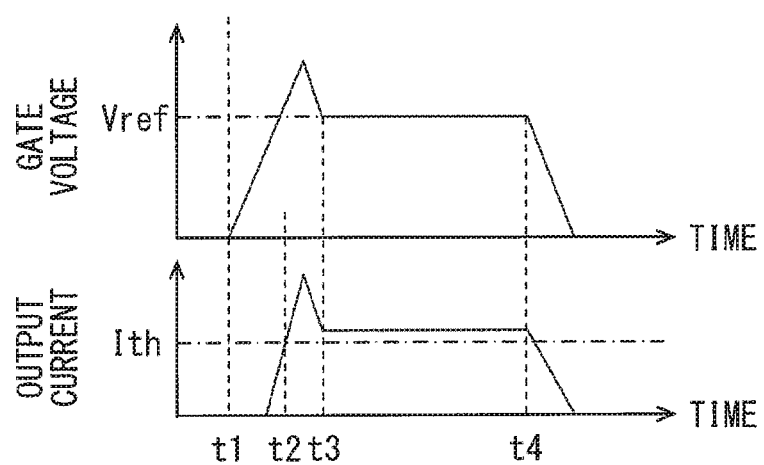
FIG. 6 shows a change in a gate voltage and a change in an output current over time.

FIG. 6 illustrates a change in the gate voltage and output current over time in a situation where the power switching device 410 is turned on. When receiving an instruction to turn on at time t1, the PMOS transistor 111 in the driver circuit 110 is turned on and the gate terminal of the transistor 411 in the power switching device 410 is started to be applied with the gate voltage.

The gate voltage rises and the output current begins to flow between the drain and source of the transistor 411. Subsequently, the value of the output current exceeds the value of the threshold current Ith for determining the short circuit at time t2. The controller 150 determines that the power switching device 410 is in a short circuit state by maintaining a state in which the value of the output current exceeds the value of the threshold current Ith during a predetermined filter time. Conventionally, the gate voltage is clamped at a predetermined constant value during the filter time. Therefore, the value of the output current is to be a constant value corresponding to the determined gate voltage. If the value of the output current is set to be excessively larger than the value of the threshold current Ith, the short circuit energy during the filter time may get unnecessarily larger.

On the other hand, the controller 150 in the present embodiment controls a voltage value of the gate voltage to be clamped based on detected voltage (the output voltage Vds between the drain and source or a voltage correlated with the output voltage Vds) detected by the voltage detector 140. In other words, as shown in FIG. 6, the controller 150 adjusts the gate voltage such that the value of the output current exceeds the value of the threshold current Ith and the exceeding margin becomes a minimum value required for detecting the short circuit. As described above, the controller 150 adjusts the reference voltage Vref, which is generated by the variable power supply 123 in the clamp circuit 120, to determine the clamp voltage. The method for determining the clamp voltage is described hereinafter in detail.

The controller 150 controls the clamp circuit 120 such that the gate voltage reaches the clamp voltage after time t2. As a result, the gate voltage becomes the clamp voltage (equal to the reference voltage Vref) at time t3.

When the output current corresponding to the clamp voltage is maintained during the filter time (t4–t2), the controller 150 determines that the power switching device 410 is in the short circuit state. The controller 150 stops the application of the gate voltage to the power switching device 410 at time t4 to turn off the power switching device 410.

Figure 7:
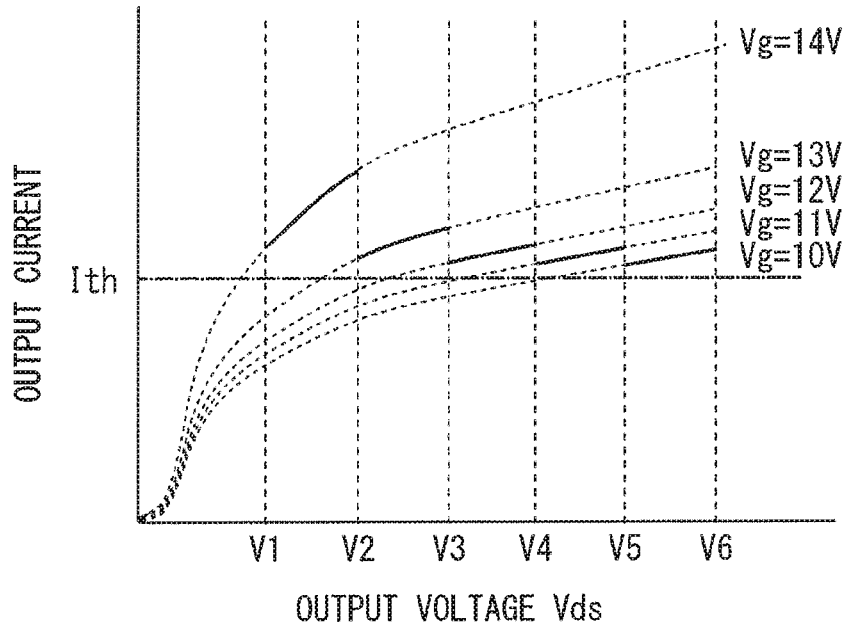
FIG. 7 shows an example of a clamp voltage to be selected when the output voltage is evenly divided.

Herein, with reference to FIG. 7, the method for determining the clamp voltage(=Vref) to be adjusted by the clamp circuit 120.

FIG. 7 illustrates the characteristics of the power switching device 410, and illustrates that the gate voltage are divided into five levels in a step of 1V from 10V to 14V. As shown in FIG. 7, given that the same gate voltage Vg is applied, the output current of the power switching device 410 increases as the output voltage Vds increases. Furthermore, the output current increases as the gate voltage Vg increases.

The controller 150 determines the gate voltage to be clamped as follows with respect to the voltages V1 to V6, which divide the output voltage Vds into equal parts. In other words, the controller 150 sets Vref(=Vg)=14V when Vds is detected as the output voltage in a range $V1 \leq Vds < V2$, sets Vref=13V when Vds is detected as the output voltage in a range $V2 \leq Vds < V3$, sets Vref=12V when Vds is detected as the output voltage in a range $V3 \leq Vds < V4$, sets Vref=11V when Vds is detected as the output voltage in a range $V4 \leq Vds < V5$, and sets $Vref=10V$ when Vds is detected as the output voltage in a range $V5 \leq TVds < V6$. In other words, while the value of the output current exceeds the value of the threshold current Ith in a range of a certain output voltage Vds, the smallest possible gate voltage is selected. Therefore, in the respective ranges of the output voltage Vds, the output current flowing between the drain and source can be set as the minimum required current value for determining the short circuit as indicated by a solid line in FIG. 7.

Conventionally, it is required to set the clamp voltage of the gate voltage at 14V to ensure that, for example, the output voltage is within the range $V1 \leq Vds < V2$. In a situation where the output voltage is in the range $V5 \leq Vds < V6$, the gate voltage is excessive for short circuit detection that causes a short circuit energy to increase.

The controller 150 in the present embodiment adopts a clamp voltage corresponding to a voltage range with respect to the output voltage Vds divided evenly, that is, in a range from V1 to V6 as the gate voltage. In particular, the gate voltage is set to be at a lower value as the output voltage Vds is larger. Thus, the short circuit energy can be suppressed as compared with a situation where the gate voltage is set uniformly.

The present embodiment illustrates an example in which the allocation of the output voltage Vds is discretely arranged so that, as a result, the gate voltage Vg to be selected is also discretely set. In particular, the gate voltage Vg to be selected is in increments of 1V as one of examples. However, the value of the gate voltage Vg is not necessarily to be discrete. The selected gate voltage Vg may be set so that the value of the output current exceeds the value of the threshold current Ith for determining the short circuit. It is preferable that the allocation of the output voltage Vds or the increment of the corresponding gate voltage Vg is subdivided. More preferably, it is better that the gate voltage Vg changes continuously with respect to the output voltage Vds. With regard to the I-V characteristics of the power switching device 410, the characteristic data of each element may be preliminarily stored in a memory or the like (not shown).

The suppressing effect on the short circuit energy through such an operation is particularly effective to the power switching device in which the saturation current during the short circuit strongly depends on the output voltage. For example, in a wide-bandgap semiconductor having SiC, GaN or diamond as a main component, since the dielectric breakdown electric field is higher as compared with a general semiconductor device having Si as a main component, the drift layer to be a resistive component can be thinned. Therefore, the proportion of the channel resistance with respect to the whole is relatively large. Accordingly, it is required to shorten the length of the channel for lowering the resistance of the whole device. When the length of the channel is shortened, the saturation current during the short circuit becomes more dependent on the output voltage. In other words, the operation of the above-mentioned controller 150 is particularly effective when the power switching device is configured by the wide-bandgap semiconductor as the main component.

First Modified Example

Figure 8:
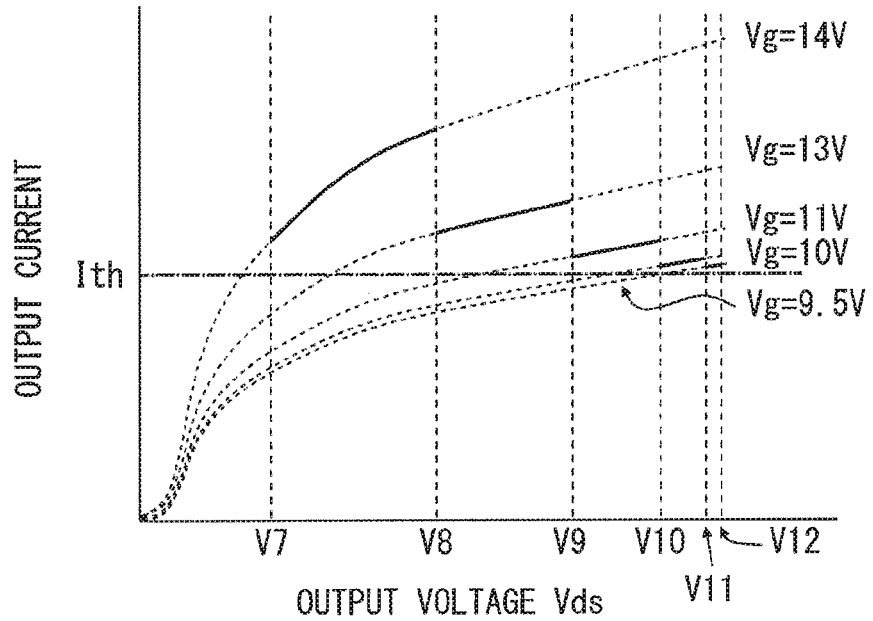
FIG. 8 shows an example of a clamp voltage to be selected when the output voltage is unevenly divided.

The first embodiment shows an example in which the gate voltage Vg to be clamped is determined based on voltages V1 to V6, which divide the output voltage Vds into equal parts, as shown in FIG. 7. Herein, the output voltage Vds may not be divided into equal parts. As shown in FIG. 8, the voltages V7 to V12 may be determined that the output voltage Vds is subdivided into smaller parts as the output voltage Vds increases. That is, the output voltage Vds is allocated such that the section V9-V8 is smaller than the section V8-V7, and similarly, the section V12-V11 is further smaller.

The gate voltage to be clamped is determined as follows. In other words, the controller 150 sets $Vref(=Vg)=14V$ when Vds is detected as the output voltage in a range $V7 \leq Vds < V8$, sets $Vref=13V$ when Vds is detected as the output voltage in a range $V8 \leq Vds < V9$, sets $Vref=11V$ when Vds is detected as the output voltage in a range $V9 \leq Vds < V10$, sets $Vref=10V$ when Vds is detected as the output voltage in a range $V10 \leq Vds < V11$, and sets $Vref=9.5V$ when Vds is detected as the output voltage in a range $V11 \leq Vds < V12$.

In each range of the output voltage Vds, the output current flowing between the drain and source can be set to the current value indicated by a solid line in FIG. 8.

With regard to this example, as compared with the output voltage Vds being divided into equal parts in the first embodiment, in a region where the output voltage Vds is relatively large, the gate voltage is set finely to further lower the output current. The short circuit energy increases in a region where the output voltage Vds is relatively large. For this reason, in the present modified example in which the gate voltage can be determined in detail to lower the output current as smaller as possible, and thus the short circuit energy can be suppressed.

Second Embodiment

In the first embodiment and its modified example, the clamp voltage is determined based on only the output voltage Vds. In contrast, the information related to the temperature of the power switching device 410 and the information related to the load of the motor 200 are input to the controller 150 in the semiconductor device 100 according to the present embodiment.

The controller 150 determines the reference voltage Vref (=clamp voltage) based on the temperature of the power switching device 410 and the load condition of the motor 200 in addition to the output voltage Vds to be detected by the voltage detector 140.

For example, the controller 150 sets the reference voltage Vref to be smaller as the temperature of the power switching device 410 is lower. Even with the same output voltage Vds, the output current increases as the device temperature decreases.

The controller 150 sets the reference voltage Vref to be smaller as the load of the motor 200 is larger due to a large torque of the motor 200 or a large output. The load of the motor 200 being large means that the voltage across the both ends of the switching series circuit of the power switching devices 410 in the voltage converter circuit 400 is large, and means that the output voltage Vds of the power switching device 410 is large. Accordingly, when the load is larger, the controller 150 sets the reference voltage Vref to be smaller.

Third Embodiment

In the above-mentioned embodiments and modification example, when the gate voltage is applied to the power switching device 410, the voltage Vds between the drain and source of the power switching device 410 is used as a characteristic value to be referred for selecting the clamp voltage (=the reference voltage Vref).

However, the voltage to be referred for selecting the clamp voltage is not limited to Vds. For example, the voltage (VH) across both ends of the switching series circuit having the power switching devices 410 in the voltage converter circuit 400 may also be used.

Figure 9:
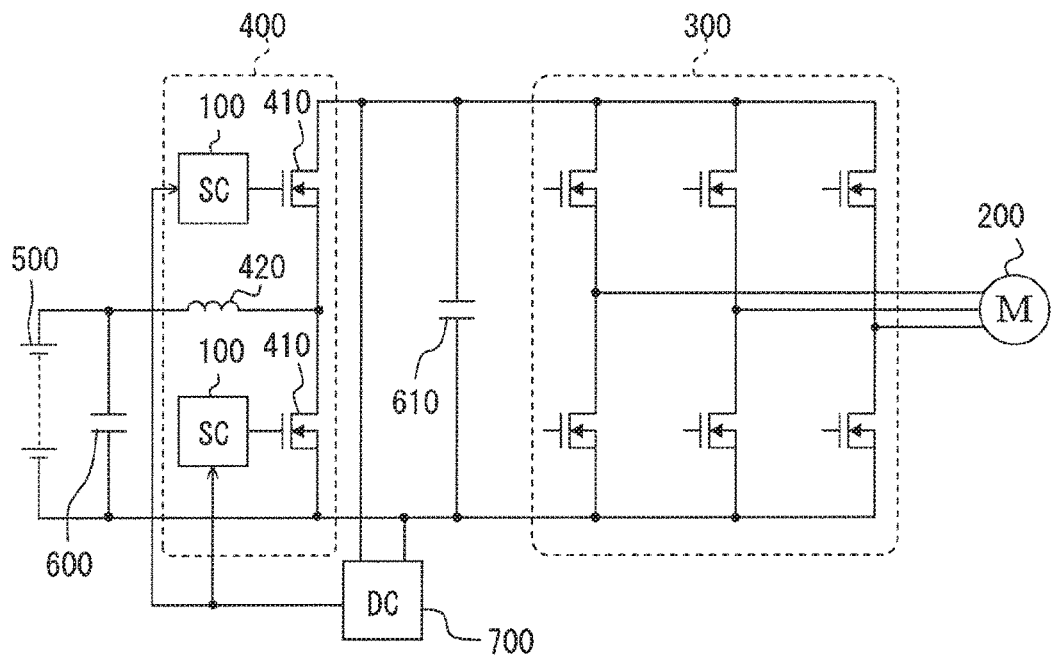
FIG. 9 is a circuit diagram that illustrates a schematic configuration of the power converter according to a third embodiment.

As shown in FIG. 9, the voltage VH is to be detected by a detection circuit 700, which acquires the voltage across both ends in the voltage converter circuit 400. The voltage to be detected is equivalent to the voltage across both ends of a capacitor 610. The voltage VH, which is in replacement of the output voltage Vds, is input to the controller 150 of the semiconductor device 100, and the magnitude of the reference voltage Vref is controlled based on the voltage VH. For the detection circuit 700, a general voltage detection circuit can be used. In FIG. 9, SC denotes the semiconductor device 100; DC denotes the detection circuit 700; and M denotes the motor 200.

The voltage VH is a value that also reflects the load condition of the motor 200. For this reason, as long as the clamp voltage is determined based on the voltage VH, it is not required that the controller 150 refers to the information on the load condition of the motor 200 again as described in the second embodiment. Since the value of the voltage VH is a characteristic value to be used other than the control of the gate voltage described in the present specification, for example, the control of a vehicle, it is not necessary to provide a specialized detection circuit or control mechanism for determining the clamp voltage. Thus, the clamp voltage can be determined with a simpler configuration as compared with the configuration in which the output voltage Vds is referred to determine the clamp voltage.

Since the voltage VH is correlated with the output voltage Vds of the power switching device 410, the controller 150 determines the clamp voltage through the same control as the one in the first embodiment with reference to FIGS. 6 to 8. At this time, the voltage VH is adopted as a voltage for the I-V characteristics of the power switching device 410.

Fourth Embodiment

Figure 10:
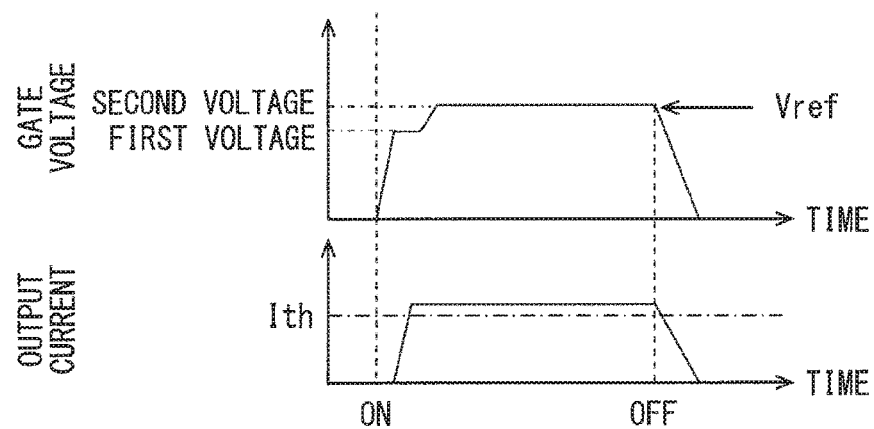
FIG. 10 is a drawing that illustrates a change in a gate voltage and a change in output current over time in a fourth embodiment.

The following describes a mode in which the power switching device 410 is turned on by changing the gate voltage in two steps. As shown in FIG. 10, in the so-called active gate control by applying the gate voltage during the turn-on of the power switching device 410, the driving ability of the driver circuit 110 is set relatively high in the first-stage of the application in which the gate voltage is changed from the non-application state to the first voltage. Subsequently, in the second-stage application in which the gate voltage is changed from the first voltage to the second voltage, the driving ability is set to be relatively low as compared with the first-stage transition. Thus, the total time for applying the gate voltage is shortened while the overshoot of the gate voltage is suppressed so that the power consumption during the turn-on operation is reduced.

When the value of the output current of the power switching device 410 exceeds the value of the threshold current Ith when the gate voltage reaches the first voltage, the controller 150 is shifted into the phase for determining the short circuit as similar to the situation in each of the above-mentioned embodiments. In other words, the clamp circuit 130 is controlled to clamp the gate voltage. In the present embodiment, the controller 150 controls the clamp circuit 130 such that the second voltage as the gate voltage at the second stage is to be the clamp voltage(=reference voltage Vref).

Thus, it is possible to achieve the active gate control while suppressing the magnitude of the output current when determining the short circuit to a minimum required value for determination. In addition, it is possible to reduce the short circuit energy.

Other Embodiments

While preferred embodiments of the present disclosure have been described above, the present disclosure is not limited in any way by the embodiments described above, and may be carried out with various modifications without departing from the scope of the subject matter of the present disclosure.

Each of the above-mentioned embodiments, with regard to a power converter provided for driving the motor 200, illustrates an example in which the semiconductor device 100 is adopted for the voltage circuit 400. The effect of the semiconductor device 100 is effective to a device for controlling the gate voltage of the switching device to control the current flowing through the load, and therefore it is not only applied to a power converter.

With regard to the particular configuration of the clamp circuit 120, the negative feedback circuit with the use of the operational amplifier 121 as shown in FIG. 2 is illustrated as an example. However, any circuit for controlling the charge injection to the gate terminal of the power switching device 410 or controlling charge attraction from the gate terminal of the power switching device 410 may also be used.

Similarly, the output current detector 130 and the voltage detector 140 may not only be limited to the configuration with the use of the comparator as illustrated in FIGS. 4 and 5.

Although the present disclosure has been described in accordance with the embodiments, it is understood that the present disclosure is not limited to the above embodiments or structures. Various changes and modification may be made in the present disclosure. In addition, various combinations and configurations, as well as other combinations and configurations that include only one element, more, or less, fall within the scope and spirit of the present disclosure.

The invention claimed is:

1. A semiconductor device controlling a power switching device to turn on and off, the power switching device having a gate terminal and output terminals between which an output current is produced by a gate voltage applied to the gate terminal, the semiconductor device comprising:
    an output current detector configured to detect a current value correlated with the output current;
    a voltage detector configured to detect a voltage, which is across the output terminals of the power switching device or is correlated with the voltage across the output terminals;
    a clamp circuit configured to clamp the gate voltage at a predetermined value; and
    a controller configured to control the clamp circuit to adjust the gate voltage based on the voltage detected by the voltage detector, wherein:
    the controller controls the clamp circuit to set the gate voltage to be at a minimum voltage according to the detected voltage to cause the output current, which flows during having a short circuit in the power switching device, to be larger than a threshold current required for detecting the short circuit in the power switching device.

2. The semiconductor device according to claim 1, wherein:
    the controller determines the gate voltage continuously according to the voltage, which is across the output terminals of the power switching device or is correlated with the voltage across the output terminals.

3. The semiconductor device according to claim 1, wherein:
the controller determines the gate voltage discretely according to the voltage, which is across the output terminals of the power switching device or is correlated with the voltage across the output terminals.

4. The semiconductor device according to claim 3, wherein:
the voltage, which is across the output terminals of the power switching device or is correlated with the voltage across the output terminals, is divided into equal sections; and
the controller determines the gate voltage according to the voltage.

5. The semiconductor device according to claim 3, wherein:
the voltage, which is across the output terminals of the power switching device or is correlated with the voltage across the output terminals, is subdivided into smaller sections as the detected voltage increases; and
the controller determines the gate voltage according to the voltage.

6. The semiconductor device according to claim 1, wherein:
the power switching device is configured by a wide-bandgap semiconductor.

7. The semiconductor device according to claim 1, wherein:
the clamp circuit includes an operational amplifier, a MOS transistor, and a variable power supply configured to generate a reference voltage;
the gate terminal of the power switching device is connected to a non-inverting input terminal of the operational amplifier;
a drain terminal of the MOS transistor is connected to the non-inverting input terminal of the operational amplifier, and is connected to the gate terminal of the power switching device;
a source terminal of the MOS transistor is connected to a reference potential, which has a voltage lower than the gate voltage;
an inverting input terminal of the operational amplifier is connected with the variable power supply to be at the reference voltage; and
the controller determines the reference voltage to adjust the gate voltage.

8. The semiconductor device according to claim 1, wherein:
the minimum voltage is set as the gate voltage to detect the short circuit in the power switching device.

9. The semiconductor device according to claim 4, wherein:
a range of the voltage, which is across the output terminals or is correlated with the voltage across the output terminals, is divided into equal sections.

10. The semiconductor device according to claim 5, wherein:
a range of the voltage, which is across the output terminals or is correlated with the voltage across the output terminals, is subdivided into smaller sections as the detected voltage increases.

* * * * *